(12) United States Patent
Crick

(10) Patent No.: US 6,559,651 B1
(45) Date of Patent: May 6, 2003

(54) METHOD FOR LOCATING AN OPEN IN A CONDUCTIVE LINE OF AN INSULATED CONDUCTOR

(76) Inventor: Robert G. Crick, P.O. Box 8009, Rancho Santa Fe, CA (US) 92067

( * ) Notice: Subject to any disclaimer, the term of this patent is extended or adjusted under 35 U.S.C. 154(b) by 0 days.

(21) Appl. No.: 09/697,763

(22) Filed: Oct. 25, 2000

(51) Int. Cl.[7] ............................. G01R 31/28; H04B 3/46
(52) U.S. Cl. .................... 324/522; 324/529; 324/543
(58) Field of Search ................................ 324/522, 523, 324/524, 534, 544, 551, 529, 543

(56) References Cited

U.S. PATENT DOCUMENTS 5,608,328 A * 3/1997 Sanderson .................. 324/133

* cited by examiner

Primary Examiner—Christine Oda
Assistant Examiner—J Kerveros

(74) Attorney, Agent, or Firm—Rodney F. Brown

(57) ABSTRACT

A method includes locating an open in a conductive line of an insulated conductor surrounded by an insulative sheath. In accordance with one embodiment, the insulated conductor is beneath an earthen surface and a locator signal and carrier signal including synchronization are introduced into the conductive line. A ground current is capacitively transmitted from capacitive points along the conductive line across the insulative sheath to a ground reference in response to the locator and carrier signals. A ground locator signal and a ground carrier signal are received in response to the ground current flowing past a pickup positioned in electrical communication with earth at a downstream point proximal to one of the capacitive points. The ground locator signal has a real component and a quadrature component and the ground carrier signal has real and quadrature synchronization. The quadrature component, which is indicative of the open, is detected using the quadrature synchronization to exclude the real component. The pickup is incrementally repositioned at succeeding downstream points proximal to the insulated conductor and the open is located where the quadrature component exhibits an abrupt change.

19 Claims, 5 Drawing Sheets

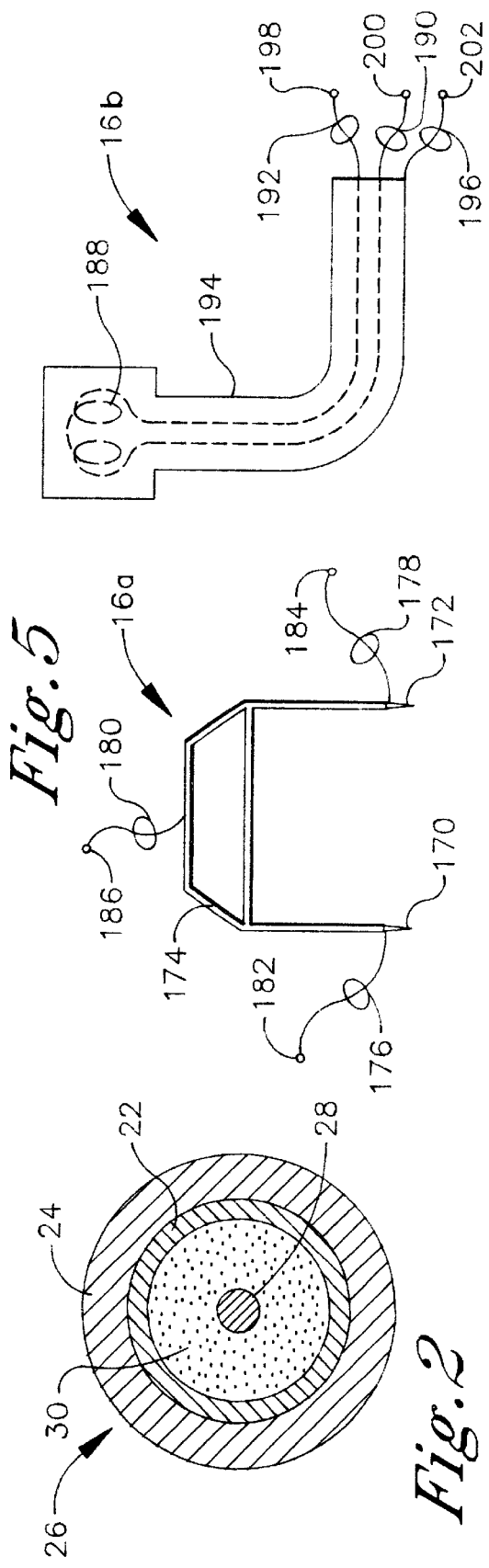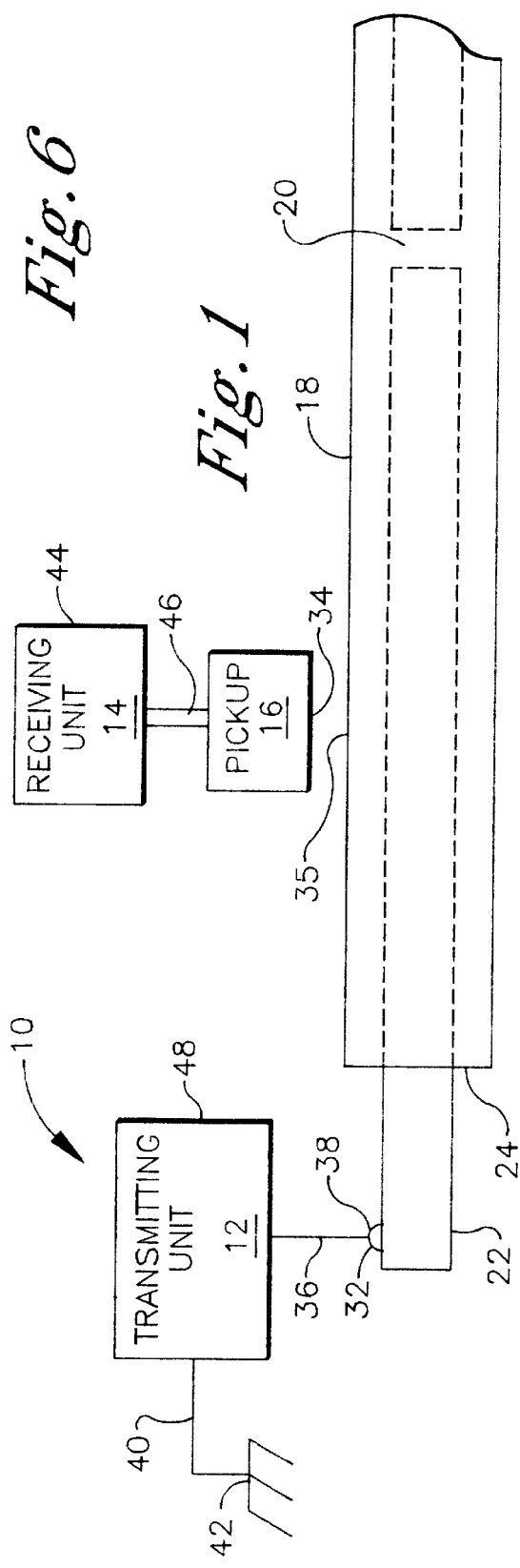

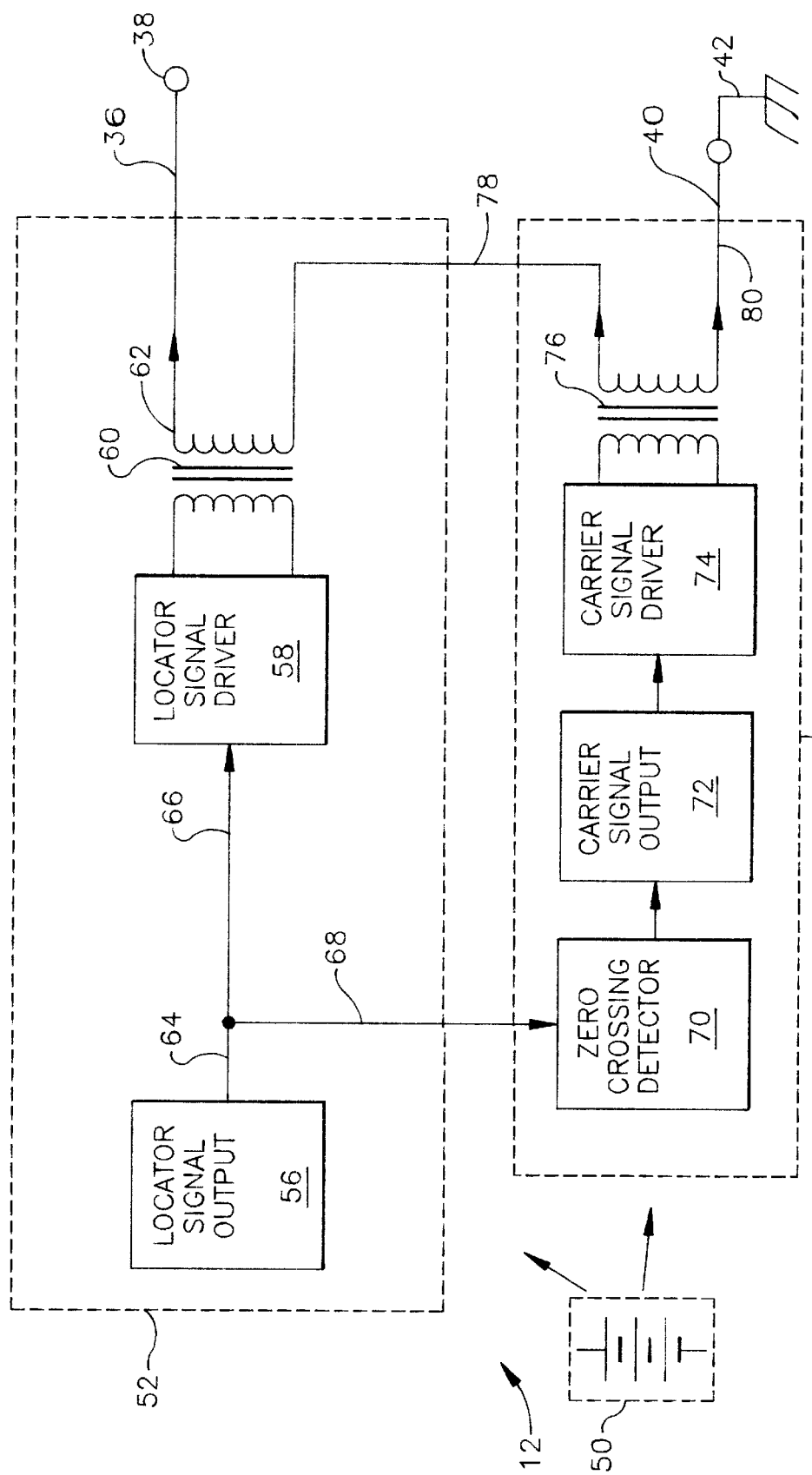

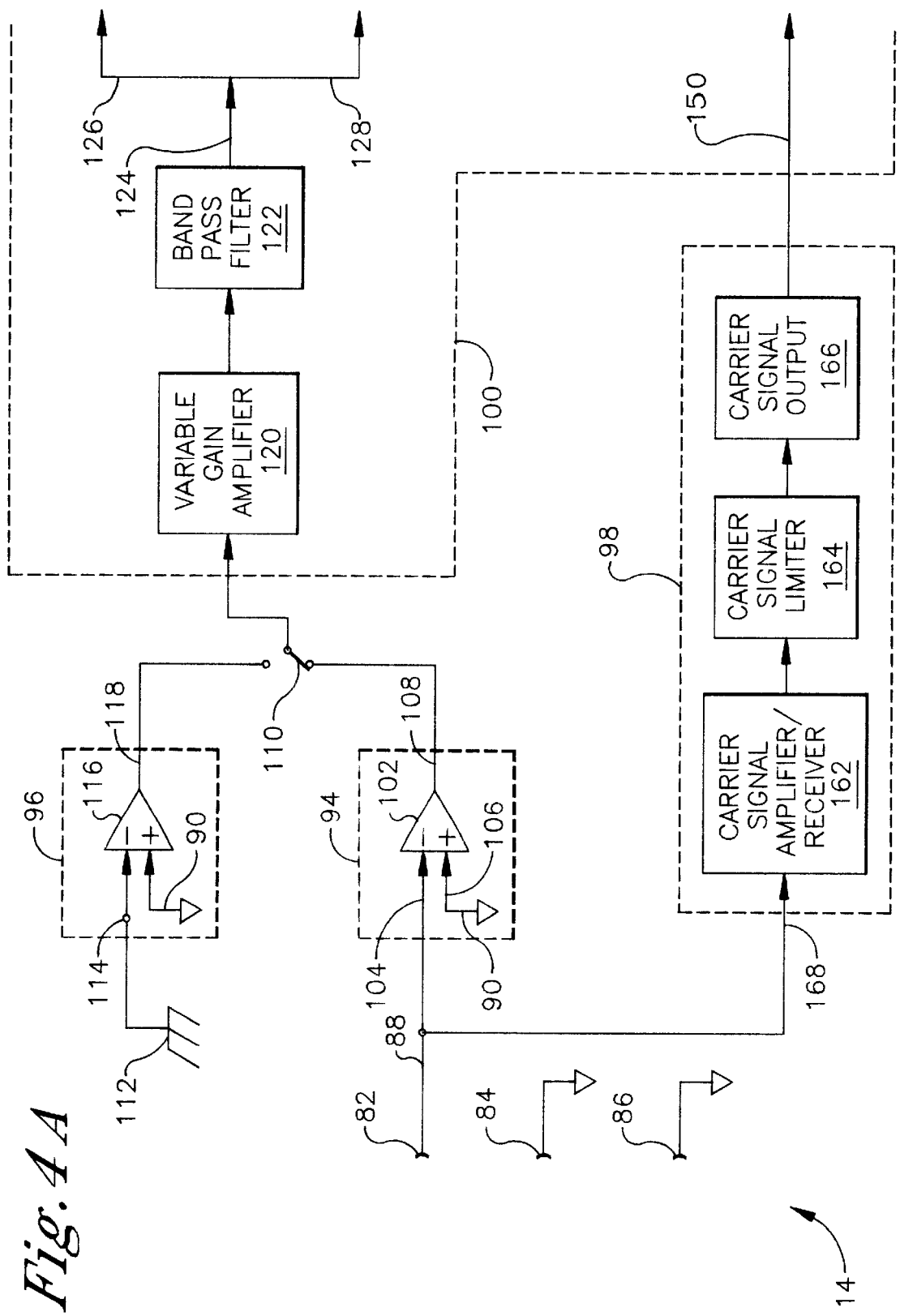

METHOD FOR LOCATING AN OPEN IN A CONDUCTIVE LINE OF AN INSULATED CONDUCTOR

TECHNICAL FIELD

The present invention relates generally to location of opens in a conductive line of an insulated conductor, and more particularly, to a method for locating opens in the conductive line of the insulated conductor by monitoring a locator signal introduced into the conductive line.

BACKGROUND OF THE INVENTION

A shielded cable is a conventional means of carrying telecommunications transmissions. A plurality of paired lines are bundled together in a shielded cable and surrounded by a conductive shield which in turn is surrounded by an insulative sheath. Each paired line of the shielded cable is capable of independently carrying a telecommunications signal. Shielded cables are generally effective telecommunications carriers, however, a type of fault termed an open can occasionally occur in the shield which interferes with the quality of the telecommunications transmissions. The open allows an increased coupling of extraneous voltages into one or more enclosed paired lines of the shielded cable from nearby sources, such as power transmission cables The open typically causes noise in the affected paired lines which is extremely disruptive to the clarity of the telecommunications signal sent over the paired line Therefore, it is desirable to locate and repair opens in telecommunications cables.

Since telecommunications cables are not always readily accessible, often being buried below ground, noninvasive methods are preferred for locating faults in telecommunications cables. Tone location methods are a noninvasive means for locating resistance faults in paired lines of telecommunications cables using an audible tone as a locator signal. One such effective method is taught by U.S. Pat. No. 5,995,588. However, the method is less effective for locating opens in the shield.

Accordingly, it is an object of the present invention to provide a method for effectively locating opens in a conductive line of an insulated conductor using a locator signal. In particular, it is an object of the present invention to provide a method for effectively locating opens in a conductive shield of a shielded cable using a locator signal. It is a further object of the present invention to provide a method for effectively locating opens in the shield of a shielded cable using a device which is fully portable in the field for expeditiously tracking relatively long lengths of the shielded cable. These objects and others are accomplished in accordance with the invention described hereafter.

SUMMARY OF THE INVENTION

The present invention is a method for locating an open in a conductive line of an insulated conductor surrounded by an insulative sheath. In accordance with a first embodiment, the insulated conductor is beneath an earthen surface. A locator signal and a carrier signal including synchronization of the locator signal are introduced into the conductive line of the insulated conductor at a transmission point. A ground current is capacitively transmitted from capacitive points along the conductive line across the insulative sheath through earth to a ground reference in response to the locator and carrier signals. The capacitive points are downstream of the transmission point and upstream of the open in the conductive line. The transmission point is positioned between the ground reference and the capacitive points.

A ground locator signal and a ground carrier signal are received in response to the ground current flowing through earth to the ground reference past a pickup positioned at a downstream point proximal to one of the capacitive points. The pickup has a first probe and a second probe spaced apart from one another along a pickup axis. The first and second probes are in electrical communication with earth at the downstream point to receive the ground current. The pickup axis is aligned substantially perpendicular to the longitudinal axis of the insulated conductor at the capacitive point and is positioned a proximal to the insulated conductor.

The ground locator signal has a real component and a quadrature component differing from the real component by a 90° phase shift. The ground carrier signal has real synchronization and quadrature synchronization. The quadrature component, which is indicative of the open, is detected using the quadrature synchronization to exclude the real component. The pickup is incrementally repositioned at succeeding downstream points proximal to the insulated conductor and away from the transmission point. The open is located at a point on the insulated conductor proximal to a succeeding downstream point where the quadrature component exhibits an abrupt change. A resistance fault in the insulated sheath may also be located in accordance with the present embodiment at a point on the insulated conductor proximal to a succeeding downstream point where the real component substantially exceeds the quadrature component.

In accordance with a second embodiment of the present invention, the insulated conductor is on or above an earthen surface. A locator signal and carrier signal are introduced into the conductive line in substantially the same manner as recited above. A capacitive pickup is moved along the insulated conductor downstream of the transmission point and upstream of the open. A capacitive current is capacitively transmitted from capacitive points along the conductive line across the insulative sheath to the capacitive pickup in response to the locator and carrier signals. A capacitive locator signal and a capacitive carrier signal are received in response to capacitive transmission of the capacitive current from the pickup to an ungrounded common. The capacitive locator signal has a real component and a quadrature component and the capacitive carrier signal has real synchronization and quadrature synchronization. The quadrature component is detected using the quadrature synchronization to exclude the real component. The open is located at a point on the insulated conductor where the quadrature component exhibits a significant abrupt change.

The present invention will be further understood, both as to its structure and operation, from the accompanying drawings, taken in conjunction with the accompanying description, in which similar reference characters refer to similar parts

BRIEF DESCRIPTION OF THE DRAWINGS

FIG. 1 is a schematic view of an open locating device having utility in the method of th resent invention.

FIG. 2 is a conceptual cross-sectional view of a shielded cable, to which the open locating method of the present invention is applied.

FIG. 3 is a block diagram of the transmitting unit shown in the device of FIG. 1.

FIGS. 4A and 4B are a block diagram of the receiving unit shown in the device of FIG. 1.

FIG. 5 is a conceptual view of a specific pickup configuration having utility in an embodiment of the method of the present invention.

FIG. 6 is a conceptual view of another specific pickup configuration having utility in an alternate embodiment of the method of the present invention.

DESCRIPTION OF PREFERRED EMBODIMENTS

Figure 4B:
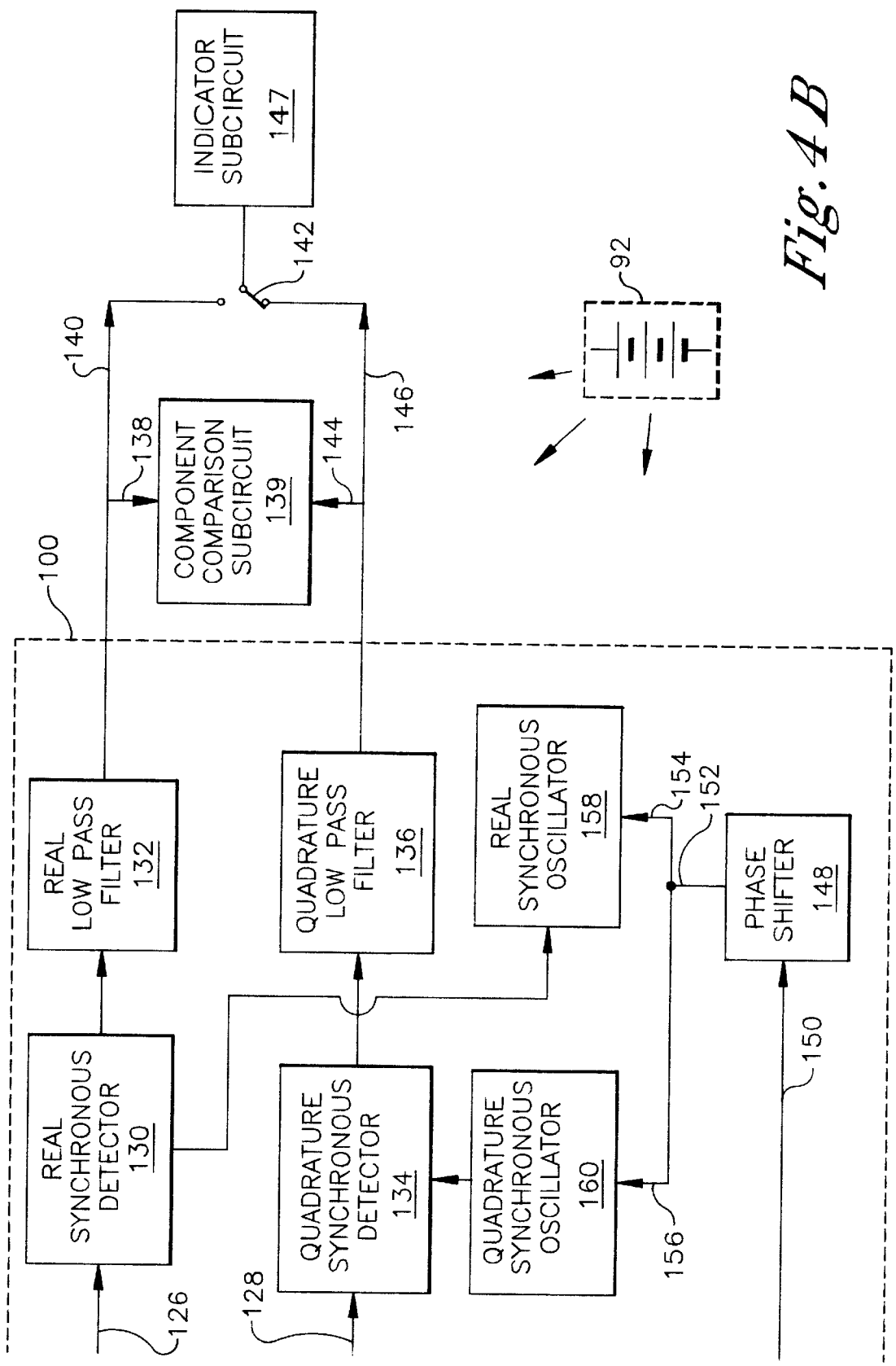

The method of the present invention has general utility to locating opens in insulated conductors employed in any number of different applications, including power transmission and communications networks. The method has particular utility to locating opens in shielded cable employed in telecommunications networks, including accessible shielded cable, such as aerial shielded cable, and inaccessible shielded cable, such as buried shielded cable.

Referring initially to FIG. 1, an open locating device having utility in the method of the present invention is shown and generally designated 10. The open locating device 10 comprises a transmitting unit 12, a receiving unit 14 and a pickup 16 associated with the receiving unit 14. The open locating device 10 is operable positioned relative to an insulated conductor 18 in which it is desired to locate an open 20. The insulated conductor 18 is generally defined herein as any electrically conductive line 22 continuously coated or otherwise continuously enclosed along its length by an electrically insulative sheath 24, such as conventional plastic wire insulation. An exemplary conductive line is a copper wire which may be solid or braided and which may be grounded or ungrounded. An exemplary insulative sheath is a coating of conventional plastic wire insulation. An open is defined herein as any unintended discontinuity or break in the conductive line of the insulated conductor which undesirably interrupts the flow of current through the line. Opens are frequently caused by corrosion of the conductive line or stress on the insulated conductor. As such, older insulated conductors are particularly susceptible to opens.

Referring to FIG. 2, a shielded cable 26 is shown, which is a specific case of an insulated conductor as generally defined herein. The conductive line 22 of the shielded cable 26 enclosed within the insulative sheath 24 is termed a shield. The shield 22 is tubularly configured and one or more additional conductive lines run concentrically or coaxially through the interior of the shield 22. For purposes of illustration, only a single additional conductive line 28 is shown in FIG. 2. The one or more additional conductive lines 28 are typically metal wires which are electrically insulated from the shield 22 and from one another by means of an electrically insulative material 30 positioned in the annulus between the shield 22 and the conductive line 28

Referring back to FIG. 1, the transmitting unit 12 is operably positioned at a transmission point 32 on the insulated conductor 18 while the pickup 16 of the receiving unit 14 is operably positioned at a downstream point 34 adjacent to a capacitive point 35 on the insulated conductor 18. The transmission point 32 is preferably selected at a point on the insulated conductor 18 where relatively convenient electrical access to the electrically conductive line 22 is provided, such as a junction box or other splice location. The transmitting unit 12 is coupled with the conductive line 22 by means of a test lead 36 extending from the transmitting unit 12 and an electrically conductive connector 38, such as a conventional alligator clip or the like, on the end of the test lead 36. A ground lead 40 is also provided, coupling the transmitting unit 12 with a ground reference 42 which is preferably a ground rod.

As will be described in greater detail hereafter, the position of the transmission point 32, and correspondingly the position of the transmitting unit 12, are substantially fixed relative to the insulated conductor 18 during a given open locating sequence. In contrast, the position of the downstream point 34, and correspondingly the position of the pickup 16, are variable relative to the insulated conductor 18 throughout a given open locating sequence. Accordingly, the pickup 16 and receiving unit 14 have a fully mobile, portable configuration which is relatively compact and lightweight to render them manually transportable by an operator. The receiving unit 14 is contained within a unitary housing 44 which is preferably a hardened protective shell fabricated from a conductive metal. The receiving unit 14 is coupled with the pickup 16 by means of a connective member 46 extending between the pickup 16 and the housing 44. The connective member 46 is typically one or more electrically conductive wires. The connective member 46 may optionally include a flexible or rigid pole to support the one or more electrically conductive wires.

Details of the transmitting unit 12 are described with further reference to the block diagram of FIG. 3. Substantially all of the circuitry of the transmitting unit 12 is enclosed in a housing 48 (shown in FIG. 1) comprising a hardened protective shell. The circuitry of the transmitting unit 12 includes a power source 50, a locator signal transmission circuit 52 and a carrier signal transmission circuit 54. As described above, the test lead 36 extends from the transmitting unit 12 and removably connects with the conductive line 22 to provide electrical communication between the circuits 52, 54 and the conductive line 22. The locator signal transmission circuit 52 is configured to generate and send locator signals along the conductive line 22 of the insulated conductor 18 from the transmission point 32 in the direction of the capacitive point 35. Included within the locator signal transmission circuit 52 is a locator signal output 56, which in the present embodiment is a locator signal oscillator. It is apparent to the skilled artisan that alternate locator signal outputs are possible within the scope of the present invention. The locator signal transmission circuit 52 further includes in series a locator signal driver 58, and a locator signal transformer 60. The outlet of the locator signal transformer 60 has an outlet winding 62 coupled with the test lead 36. The locator signal output 56 has an outlet line 64 Which is branched, with one branch line 66 extending to the locator signal driver 58 as described above and the other branch line 68 extending to the carrier signal transmission circuit 54.

The carrier signal transmission circuit 54 is configured to generate a carrier signal, provide the carrier signal with modulated synchronization, and transmit the modulated carrier signal along the conductive line 22 of the insulated conductor 18 from the transmission point 32 in the direction of the capacitive point 35. Included in series within the carrier signal transmission circuit 54 are a zero crossing detector 70, a carrier signal output 72, a carrier signal driver 74, and a carrier signal transformer 76. In the present embodiment, the carrier signal output 72 is a carrier signal oscillator. It is apparent to the skilled artisan that alternate carrier signal outputs are possible within the scope of the present invention. One outlet 78 of the carrier signal transformer 76 is coupled with the outlet winding 62 of the locator signal transformer 60 and the other outlet 80 of the carrier signal transformer 76 extends through the ground lead 40 to the ground reference 42. It is noted that the zero crossing detector 70 can be omitted from the transmitting unit 12 without disabling operation of the transmitting unit 12, as will be described hereafter.

The power source 50 is a DC power source included in the housing 48 of the transmitting unit 12. The power source 50 supplies power to the components of the transmitting unit 12 enabling the functions thereof. The power source 50 is preferably a relatively small, lightweight battery pack, such as one or more dry-cell or rechargeable batteries (e.g., D-cell batteries).

Details of the receiving unit 14 are described with further reference to the block diagram of FIGS. 4A and 4B. The receiving unit 14 includes first, second, and third releasable inlet connectors 82, 84, 86. The first connector 82 is coupled with a receiving circuit inlet line 88. The second and third inlet connectors 84, 86 are coupled with a receiving unit common 90. The receiving unit 14 further includes a power source 92, a ground locator signal receiving circuit 94, a capacitive locator signal receiving circuit 96, a carrier signal receiving circuit 98, and a signal processing circuit 100. The ground locator signal receiving circuit 94 and carrier signal receiving circuit 98 are coupled with the first inlet connector 82 via the receiving circuit inlet line 88. The capacitive locator signal receiving circuit 96 is capacitively coupled with the first inlet connector 82 in a manner described hereafter.

The ground locator signal receiving circuit 94 includes a ground locator signal amplifier 102 having a negative inlet 104 coupled with the receiving circuit inlet line 88 and a positive inlet 106 coupled with the receiving unit common 90. The ground locator signal amplifier 102 has an outlet 108 coupled with a signal processing switch 110. The capacitive locator signal receiving circuit 96 includes in series a ground reference 112, a ground pickup 114 and a capacitive locator signal amplifier 116. The ground pickup 114 is typically the housing 44 of the receiving unit 14 if it is electrically conductive. If not, the ground pickup 114 can be provided by an electrical conductor such as a metallic shield (not shown) contained within the housing 44. The ground pickup 114 is coupled with the body of an operator (not shown) holding the receiving unit 14 to provide the ground reference 112 when the operator is standing on the earth. The capacitive locator signal amplifier 116 has an outlet 118 coupled with: the signal processing switch 110. The signal processing switch 110 is coupled with the signal processing circuit 100 which enables the operator to select either the output of the ground locator signal receiving circuit 94 or output of the capacitive locator signal receiving circuit 96 as the input to the signal processing circuit 100.

The signal processing circuit 100 comprises in series a variable gain amplifier 120 and a band pass filter 122. The outlet 124 of the band pass filter 122 splits into a real component pathway 126 and a quadrature component pathway 128. The real component pathway 126 includes in series a real synchronous detector 130 and a real low pass filter 132. The quadrature component pathway 128 similarly includes in series a quadrature synchronous detector 134 and a quadrature low pass filter 136. The real low pass filter 132 has a branched outlet, wherein a first branch 138 is coupled with component comparison subcircuit 139 and a second branch 140 is coupled with an indicator switch 142. The quadrature low pass filter 136 similarly has a branched outlet, wherein a first branch 144 is coupled with the component comparison subcircuit 139 and a second branch 146 is coupled with the indicator switch 142. The indicator switch 142 selectively couples the real component pathway 126 or the quadrature component pathway 128 with an indicator subcircuit 147.

The signal processing circuit 100 is in electrical communication with the carrier signal receiving circuit 98 by means of a phase shifter 148 coupled with an outlet 150 of the carrier signal receiving circuit 98. The phase shifter 148 has an outlet 152 which splits into a real synchronization pathway 154 and a quadrature synchronization pathway 156. The real synchronization pathway 154 has a real synchronous oscillator 158 which is coupled with the real synchronous detector 130. The quadrature synchronization pathway 156 similarly has a quadrature synchronous oscillator 160 which is coupled with the quadrature synchronous detector 134. Although the real and quadrature synchronous oscillators 158, 160 are shown herein to be separate components, it is apparent to the skilled artisan that the oscillators 158, 160 can be replaced by a single oscillator or a microcontroller delivering real and quadrature synchronization in the same manner as described above.

The carrier signal receiving circuit. 98 provides an electrical pathway for communicating a demodulated ground carrier signal to the signal processing circuit 100. Included in series within the carrier signal receiving circuit 98 are a carrier signal amplifier/receiver 162, a carrier signal limiter 164 and a carrier signal output 166. In the present embodiment, the carrier signal output 166 is a carrier signal demodulator. It is apparent to the skilled artisan that alternate carrier signal outputs are possible within the scope of the present invention. As used herein, the term "limiter" is defined to encompass a conventional limiter or, in the alternative, an automatic gain control. The inlet 168 of the carrier signal amplifier/receiver 162 is coupled with the first inlet connector 82 via the receiving circuit inlet line 88.

The power source 92 is a DC power source included in the housing 44 of the receiving unit 14. The power source 92 supplies power to the components of the receiving unit 14 enabling the functions thereof. The power source 92 is preferably a relatively small, lightweight battery pack, such as described above with respect to the transmitting unit 12. It is noted that the carrier signal amplifier/receiver 162 is shown and described herein as integrated into a single structure. In practice, this integrated structure can be separated into discrete structural components performing the same functions ascribed to the integrated structure in a manner apparent to the skilled artisan.

FIG. 1 shows a schematic representation of the pickup 16 and its relation to the other components of the open locating device 10. An actual pickup having utility in the method of the present invention may have a number of alternate configurations. For example, FIG. 5 shows a configuration of a pickup 16*a* having utility in the present method which is termed an earth frame. The pickup 16*a* comprises a first probe 170 and a second probe 172. The first and second probes 170, 172 are electrically conductive and have sharpened tips, preferably being formed from a strong durable metal. The pickup 16*a* further comprises a rigid A-frame 174 on which the first and second probes 170, 172 are cooperatively mounted in spaced apart substantially parallel relation to one another. The first and second probes 170,172 are electrically insulated from one another and from the frame 174. The first and second probes 170, 172 are each coupled with a first and second probe lead 176,178, respectively, which extends away from the frame 174. The frame 174 is similarly coupled with a frame lead 180. The first and second probe leads 176,178 and frame lead 180 are provided with first, second and third outlet connectors 182,184,186, respectively, at their free ends which are capable of cooperative connection with the first, second and third inlet connectors 82,84,86, respectively. For example, the outlet connectors 182,184, 186 may be the tip, ring and sleeve contacts of conventional male telephone jacks while the inlet connectors 82, 84, 86 are the corresponding contacts of conventional female telephone jacks which provide secure yet releasable connection. The selectively releasable connectors enable the operator to interchange alternately configured pickups with the receiving unit 14 depending on the particular embodiment of the present method being practiced.

Referring to FIG. 6, an alternate configuration of a pickup 16b is shown having utility in the present invention. The pickup 16b is termed a shielded coil and comprises a coil segment 188, first and second coil leads 190, 192 extending away from the coil segment 188, an electrically-conductive coil shield 194 having an open interior which houses the coil segment 188 and the coil leads 190, 192, and a shield lead 196 which is coupled with the coil shield 194. The leads:190, 192, 196 are provided with first, second and third outlet connectors 198, 200, 202 at their free ends which are capable of cooperatively connecting with the first, second and third inlet connectors 82, 84, 86 in substantially the same manner as described above with reference to FIG. 5.

A first embodiment of the present method is described below with reference to FIGS. 1–5. The practitioner preliminarily uses conventional diagnostics to isolate and identify a section of an insulated conductor 18 potentially containing an open 20 to which the present open locating method is applicable. The section of the insulated conductor 18 is typically up to about 5000 meters in length, although practice of the present open locating method applies to sections of insulated conductors 18 having substantially greater lengths. If the insulated conductor 18 is a shielded telecommunications cable 26, wherein the shield 22 encloses multiple pairs of additional conductors 28, a specific procedure has been developed for preliminarily isolating and identifying the section containing the open 20. In accordance with this procedure, a good pair enclosed within the shield is selected as the test pair. The test pair is shorted and grounded at the mainframe (not shown). Power influence is measured and recorded at regular intervals along the cable beginning at the mainframe. The resistance of the test pair loop back to the central office is also recorded at each interval. Power influence versus resistance is plotted. Power influence should increase as a smooth curve with resistance or distance as the test pair extends away from the central office. If power influence exhibits a step increase through any particular section of the cable, an open in the shield is likely present in that section.

The present embodiment is specific to locating an open 20 in an inaccessible insulated conductor 18, such as a buried shielded cable 26 of a telecommunications network, using the open locating device 10. The operator configures the open locating device 10 for operation by coupling the earth frame pickup 16a with the receiving unit 14. In particular, the first outlet connector 182 is connected to the first inlet connector 82, the second outlet connector 184 is connected to the second inlet connector 84, and the third outlet connector 186 is connected to the third inlet connector 86. The operator selects a transmission point 32 upstream of the suspected open 20 on the identified section of the insulated conductor 18. The transmission point 32 is preferably in a pedestal or accessible splice at the beginning of the section. The ground connection of the insulated conductor 18 is disengaged at the transmission point 32 while the ground connection of the insulated conductor 18 is maintained at the opposite end of the identified section. The test lead 36 is connected to the conductive line 22 at the transmission point 32 and the ground lead 40 is connected to the ground reference 42. The ground reference 42 is preferably a ground rod driven into the earth at least 10 meters behind the transmitting unit 12 and the transmission point 32 in a direction away from the suspected open 20. The ground reference 42 is also positioned away from the ground connection of the insulated conductor 18 at the transmission point 32 and any other nearby utilities.

The presence of an open 20 in the identified section of the insulated conductor 18 is confirmed by the operator using an ohmmeter to measure the resistance of the identified section of the insulated conductor 18 to ground. A relatively low resistance value, e.g., 25 ohms, indicates the absence of an open in the identified section. A relatively high resistance value, e.g., 10,000 ohms, indicates the presence of a clean or complete open in the identified section. A relatively intermediate resistance value, e.g., 25–10,000 ohms, indicates the presence of a partial open in the identified section.

If the presence of an open 20 in the identified section of the insulated conductor 18 is confirmed, the operator sets the signal processing switch 110 in the down position which couples the ground locator signal receiving circuit 94 with the signal processing circuit 100. The DC power source 50 energizes the locator signal output 56 and locator signal driver 58 of the locator signal transmission circuit 52, which generate an AC locator signal in the form of a variable voltage sine wave. The locator signal is delivered to the locator signal transformer 60 where the voltage of the locator signal is adjusted to a predetermined level. The outlet winding 62 of the locator signal transformer 60 introduces the locator signal into the conductive line 22 through the test lead 36 and connector 38 thereby impressing a voltage on the conductive line 22.

The variable voltage sine wave of the locator signal output 56 is also transmitted to the carrier signal transmission circuit 54 where the sine wave is converted to a square wave in the zero crossing detector 70. The square wave signal is then modulated in the carrier signal output 72, which is a voltage control oscillator, by frequency shift key modulation to produce a carrier signal having modulated synchronization. The resulting carrier signal is fed through the carrier signal driver 74 to the carrier signal transformer 76 where the voltage of the carrier signal is modified. The carrier signal is then introduced into the conductive line 22 via the outlet 78 of the carrier signal transformer 76, outlet winding 62, test lead 36 and connector 38.

It is understood that the present invention can alternatively be practiced using sine wave carrier signal modulation instead of square wave carrier signal modulation. In accordance with this alternate practice, the open locating device 10 is modified by omitting the zero crossing detector 70 from the carrier signal transmission circuit 54. The frequency of the carrier signal output 72 is then varied sinusoidally in a manner which is readily apparent to the skilled artisan, rather than using frequency shift key modulation as described above. The carrier signal receiving circuit 98 is correspondingly configured to process a sine wave, rather than a square wave.

The voltage and frequency of the locator and carrier signals are preferably limited to ranges which satisfy desirable performance criteria of the open locating device 10. In particular, the lower end of the frequency range of the locator signal is preferably selected to enable detection by the receiving unit 14 and the upper end is preferably selected not to exceed the output capability of the locator signal transmission circuit 52. As such, the frequency of the locator signals is typically selected in the audible or sub-audible range. A preferred range is between about 5 and 3000 Hz and more preferably between about 10 and 300 Hz. The voltage of the locator signal is typically selected in a range between about 5 and 200 volts, and preferably at a value of about 30 volts. The carrier signal has a frequency range greater than about 1 kHz, and preferably between about 8 kHz and 30 kHz. The carrier signal typically has a voltage below about 30 volts within the prescribed frequency range and preferably has a voltage of about 20 volts.

Figure 7:
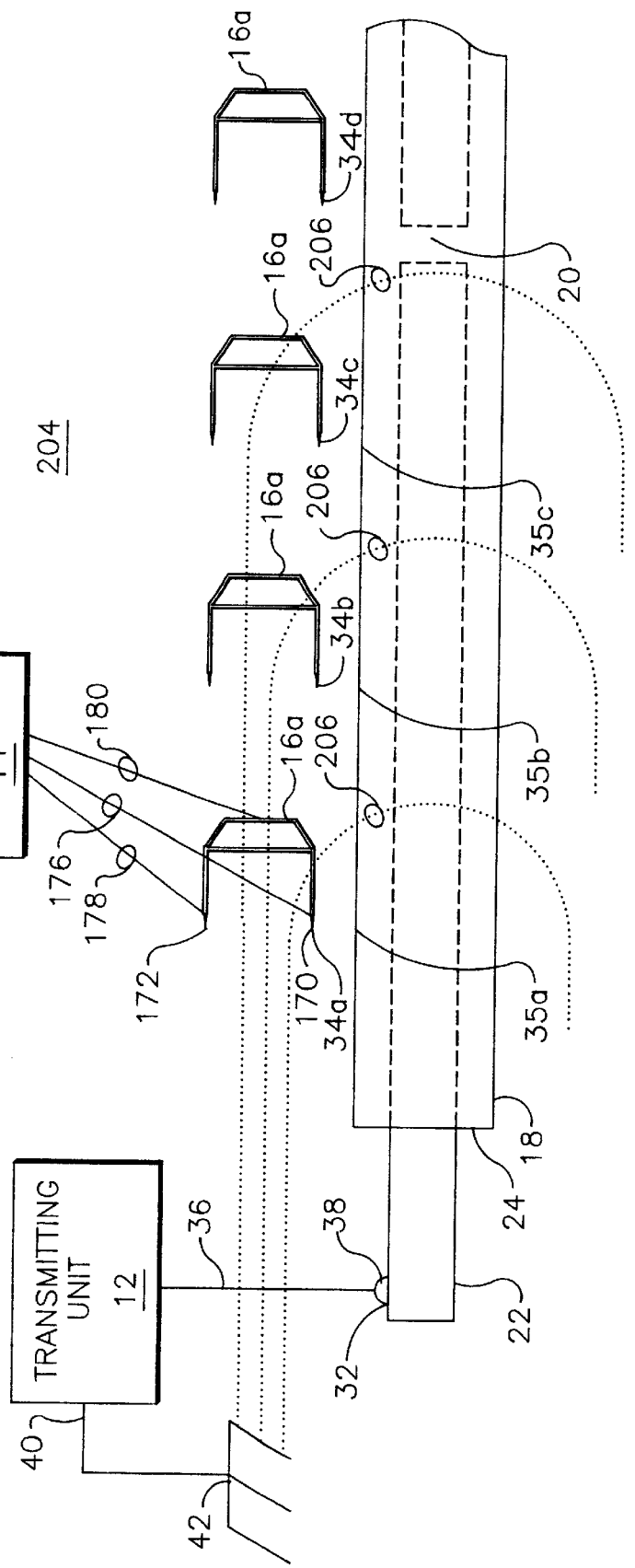
FIG. 7 is a schematic view showing the positioning of the pickup configuration of FIG. 5 relative to the insulated conductor.

Referring additionally to FIG. 7, the locator and carrier signals travel downstream through the conductive line 22 toward the open 20. However, the presence of the open 20 in the conductive line 22 directs the current of the locator and carrier signals into the earth 204 at a continuum of capacitive points 35 along the entire length of the conductive line 28 upstream of the open 20 due to capacitance between the conductive line 28 and the earth 204 across the sheath 24. This current, which is termed herein the ground current, is capacitively transmitted in a continuous series of arched pathways 206 from the continuum of capacitive points 35 on the insulated conductor 18 upstream of the open 20 back to the ground reference 42. No ground current emanates from the insulated conductor 18 downstream of the open 20 because the locator and carrier signals cannot continue through the conductive line 22 past the open 20.

In general, the operator locates the open 20 by monitoring the ground current as a function of selected downstream points 34 and corresponding capacitive points 35, wherein the selected downstream point 34 is either directly overhead the corresponding capacitive point 35 or overhead but laterally offset a relatively short distance (typically on the order of about 1 foot or less) to either side of the corresponding capacitive point 35. More particularly, the operator locates the open 20 by first marking the path of the insulated conductor 18 on the overhead surface of the earth 204 and selecting an initial downstream point 34a on the surface of the earth 204 which is an initial distance along the path of the insulated conductor 18 downstream of the transmission point 32. FIG. 7 shows selection of the initial downstream point 34a overhead, but laterally offset from the corresponding initial capacitive point 35a. FIG. 7 further shows the first probe 170 positioned at the initial downstream point 34a offset from the path of the insulated conductor 18 and the second probe 172 positioned on the same side of the path as the first probe 170, but further away from the path of the insulated conductor 18 than the first probe 170. As noted above, the initial downstream point 34a may alternately be selected directly overhead the corresponding initial capacitive point 35a, with the first or second probe 170, 172 positioned at the initial downstream point 34a on the path of the insulated conductor 18 and the remaining probe positioned away from the path of the insulated conductor 18. In yet another alternative, the initial downstream point 34a may be selected laterally offset from the corresponding initial capacitive point 35a as above. However, the first probe 170 is positioned at the initial downstream point 34a on one side of the path of the insulated conductor 18 while the second probe 172 is positioned on the opposite side such that the pickup 16a straddles the path of the insulated conductor 18.

It is apparent from the above that a number of alternate selections of the initial downstream point 34a and alternate positions of the first and second probes 170, 172 are possible within the scope of the present invention. In all cases, however, the first and second probes 170, 172 are preferably positioned such that they are not equidistant from the path of the insulated conductor 18. Furthermore, the first and second probes 170, 172 are preferably positioned such that they are aligned along a pickup axis which is substantially perpendicular to the longitudinal axis of the insulated conductor 18.

Once the first and second probes 170, 172 are appropriately positioned, they are typically electrically coupled with the earth 204 in one of two ways. If the surface of the earth 204 is soil or some other unconsolidated material at the initial downstream point 34a, the operator drives the tips of the first and second probes 170, 172 directly into the unconsolidated material. If the surface of the earth 204 is paved or otherwise consolidated at the initial downstream point 34a, the operator wets the consolidated surface and places the tips of the first and second probes 170, 172 onto the wetted surface. As the ground current flows from the initial capacitive point 35a past the first and second probes 170, 172 along a pathway 206 back to the ground reference 42, the pickup 16a receives a ground locator signal in the form of a voltage drop between the first and second probes 170, 172 which corresponds to the locator signal and receives a ground carrier signal in the form of a voltage drop between the first and second probes 170, 172 which corresponds to the carrier signal. The ground locator signal is transmitted to the ground locator signal amplifier 102 via the first probe lead 176, first outlet connector 182, first inlet connector 82, receiving circuit inlet line 88, and negative inlet 104. The ground locator signal amplifier 102 amplifies the ground locator signal and transmits it to the signal processing circuit 100 via the signal processing switch 110. The ground carrier signal is transmitted to the carrier signal receiving circuit 98 via the receiving circuit inlet line 88 and inlet 168. The carrier signal amplifier/receiver 162 amplifies and filters the ground carrier signal and the carrier signal limiter 164 subsequently limits the amplitude of the ground carrier signal. The carrier signal output 166 demodulates the ground carrier signal which is transmitted from the carrier signal output 166 to the phase shifter 148 of the signal processing circuit 100. If necessary, the phase shifter 148 corrects any phase irregularities in the ground carrier signal caused by demodulation. The phase shifter 148 has a split outlet 152, such that the ground carrier signal is transmitted in parallel to the real synchronous oscillator 158 and the quadrature synchronous oscillator 160. The real synchronous oscillator 158 produces real synchronization from the ground carrier signal and transmits the real synchronization to the real synchronous detector 130. The quadrature synchronous oscillator 160 produces quadrature synchronization from the ground carrier signal which is 90° out of phase with the real synchronization and transmits the quadrature synchronization to the quadrature synchronous detector 134.

Meanwhile, the ground locator signal is further amplified in the variable gain amplifier 120 of the signal processing circuit 100. The band pass filter 122, which is tuned to the relatively low frequency of the locator signal, rejects extraneous signals from the output of the variable gain amplifier 120 which have surrounding frequencies. In particular, the band pass filter 122 attenuates interference from 50/60 Hz signals which are magnetically induced onto the insulated conductor 18 by adjacent power lines. The ground locator signal output from the band pass filter 122 is split and fed in parallel to the real component pathway 126 and the quadrature component pathway 128 of the signal processing circuit 100. The ground locator signal may be characterized as comprising a real component and a quadrature component, one or both of which may be present at any given time during operation of the device 10. The real component of the ground locator signal corresponds to resistive current while the quadrature component of the ground locator signal corresponds to capacitive current.

The real component pathway 126 and quadrature component pathway 128 detect and segregate the respective components of the ground locator signal, based on phase synchronization. The real synchronous detector 130 utilizes the real synchronization to detect only the presence of the real component, which corresponds to the current of the ground locator signal flowing through fault resistance, and to reject any current due to conductive line-to-earth capacitance. The quadrature synchronous detector 134 conversely utilizes the quadrature synchronization to detect only the presence of the quadrature component, which corresponds to current flow into capacitance, and to reject current flowing through any fault resistance. The quadrature low pass filter 136 filters the rectified DC signal from the quadrature synchronous detector 134, allowing a narrowing of the circuit bandwidth to more effectively filter out 50/60 Hz signals and other extraneous signals having undesired frequencies. The real low pass filter 132 similarly filters the rectified DC signal from the real synchronous detector 130.

The real low pass filter 132 and quadrature low pass filter 136 output the real component and the quadrature component, respectively, to the component comparison subcircuit 139. The indicator switch 142 is initially set in the down position which also couples the quadrature low pass filter 136 with the indicator subcircuit 147 since the object of the present embodiment is to locate the open 20. The quadrature component is transmitted via the indicator switch 142 from the quadrature low pass filter 136 to the indicator subcircuit 147 which responds to the presence and magnitude of the quadrature component. In particular, the indicator subcircuit 147 employs an oscillator and an audio speaker (not shown) which generate an audible correlation of the quadrature component in the form of a continuous audible signal having an intensity directly related to the presence and voltage magnitude of the quadrature component and a frequency related to the polarity of the quadrature component.

When the first or second probe 170, 172 of the pickup 16a is positioned at the initial downstream point 34a which is downstream of the transmission point 32, but upstream of the open 20, the receiving unit 14 detects the voltage drop due to ground current flow from the initial capacitive point 35a through the earth 204 past the first and second probes 170, 172 and communicates an audible signal to the operator via the indicator subcircuit 147. The magnitude of this voltage drop, and correspondingly the level of the audible signal, will remain substantially constant at all downstream points 34 along the insulated conductor 18 before the open 20 if the distances of the first and second probes 170, 172 from the path of the insulated conductor 18 are each maintained substantially constant. Accordingly, the downstream point is repositioned at succeeding downstream points 34b, 34c, 34d which are incremental downstream distances along the path of the insulated conductor 18 away from the initial downstream point 34a and the transmission point 32. The succeeding downstream points 34b, 34c bear the same relationship to succeeding capacitive points 35b, 35c as the initial downstream point 34a bears to the initial capacitive point 35a. When the pickup 16a reaches a succeeding downstream point 34d past the open 20, the level of the audible signal drops abruptly and significantly because there is no detectable voltage drop due to capacitance along the insulated conductor 18 past the open 20. It is noted that there is no capacitive point corresponding to the downstream point 34d because there is no significant current in the insulated conductor 18 due to capacitance past the open 20. If the incremental distances are relatively large, the open 20 may be located with greater precision by iteratively repositioning the pickup 16a at successive shorter and shorter incremental distances on either side of the open 20 once the drop in the audible signal is noted. The indicator subcircuit 147 may also have a display (not shown) which provides a quantitative visual verification of the audible signal communicated to the operator. The display is a visual correlation of the magnitude of the quadrature component in the form of either an analog or a digital readout as the pickup 16a is moved to succeeding downstream points 34a, 34b, 34c, 34d.

The receiving unit 14 may also facilitate the present method by verifying the path of the inaccessible insulated conductor 18. In accordance with one technique, it is known that when the pickup 16a is positioned straddling the path of the insulated conductor 18, with the first and second probes 170, 172 equidistant from the path of the insulated conductor 18, no audible signal will be experienced. It is also known that when the first or second probe 170, 172 of the pickup 16a is positioned directly over the path of the insulated conductor 18 and the remaining probe is positioned away from the path of the insulated conductor 18, a maximum audible signal will be experienced. The audible signal falls off as a function of distance when the respective probe which is over the path of the insulated conductor 18 is moved laterally away from the path on the same side of the path as the remaining probe. Thus, the path of the insulated conductor 18 is verified by monitoring intensity fluctuations in the audible signal as the pickup 16a is moved laterally relative to the path of the insulated conductor 18. In accordance another technique, it is known that when a respective probe which is on one side of the path of the insulated conductor 18 is moved laterally across the path of the insulated conductor 18 to the opposite side of the path while maintaining the first and second probes 170, 172 an unequal distant from the path, an audible signal having a first polarity is experienced. If the respective probe is moved back over the path of the insulated conductor 18 while maintaining the relative distances of the first and second probes 170, 172 from the path, the polarity of the audible signal is reversed. Thus, the path of the insulated conductor 18 is verified by monitoring polarity fluctuations in the audible signal which produce distinctly different sounds as the first and second probes 170, 172 are moved laterally back and forth across the path of the insulated conductor 18.

The present embodiment can also be modified to locate sheath faults in an insulated conductor. While the operator is monitoring the indicator subcircuit 147, the component comparison circuit 139 simultaneously compares the output levels of the real low pass filter 132 and quadrature low pass filter 136. When the output level of the real low pass filter 132 exceeds the output level of the quadrature low pass filter 136, the component comparison circuit 139 notifies the operator that a sheath fault is present in the sheath 24 of the insulated conductor 18 upstream of the open 20 by means of a visual or audible indicator (not shown). The operator may then manually reset the indicator switch 142 in the up position to more precisely locate the sheath fault, if necessary, using the real component of the ground locator signal. In accordance with this embodiment, the pickup 16a is iteratively positioned at different downstream points 34 which are believed proximal to the location of the sheath fault until a maximum level of the real component of the ground locator signal is experienced, which precisely identifies the location of the sheath fault.

Referring to FIGS. 1–4 and 6, an alternate embodiment of the present method is provided wherein an open 20 is located in an accessible insulated conductor 18, such as aerial shielded cable of a telecommunications network, using the open locating device 10. The operator configures the open locating device 10 for operation by coupling the pickup 16b with the receiving unit 14. In particular, the first outlet connector 198 is connected to the first inlet connector 82, the second outlet connector 200 is connected to the second inlet connector 84, and the third outlet connector 202 is connected to the third inlet connector 86. The operator selects a transmission point 32 upstream from the suspected open 20 on the identified section of the insulated conductor 18. The transmission point 32 is preferably in a terminal or closure at the beginning of the section. The ground connection of the insulated conductor 18 is disengaged at the transmission point 32 while the ground connection is maintained at the opposite end of the identified section. The test lead 36 is connected to the conductive line 22 at the transmission point 32 and the ground lead 40 is connected to the ground reference 42. The ground reference 42 may be a ground rod, a supporting strand (not shown) of the insulated conductor 18, or the conductive line 22 at the end of the good incoming section (not shown) of the insulated conductor 18.

The signal processing switch 110 is reset in the up position to couple the capacitive locator signal receiving circuit 96 with the signal processing circuit 100. Locator and carrier signals are introduced into the conductive line 28 in the same manner as described above with respect to the previous embodiment. The locator and carrier signals travel downstream through the conductive line 28 toward the open 20. The pickup 16b is initially positioned at a downstream point 34 in contact with a capacitive point 35 on the insulated conductor 18 immediately downstream of the transmission point 32 and continuously moved along the insulated conductor 18 downstream of the open 20 in the direction of the open 20. The presence of the open 20 in the conductive line 28 directs the current of the locator and carrier signals from a continuum of capacitive points 35 along the entire length of the conductive line 28 upstream of the open 20 into the pickup 16b at a continuum of downstream points 34 due to capacitance between the conductive line 28 and the coil segment 188 across the sheath 24. This current, termed herein the capacitive current, is no longer present downstream of the open 20 because the locator and carrier signals cannot continue through the conductive line 22 past the open 20. Thus, the operator locates the open 20 by detecting changes in the capacitive current as a function of selected downstream points 34.

In particular, the coil shield 194 of the pickup 16b impresses a capacitive locator signal corresponding to the locator signal onto the receiving unit common 90 via the shield lead 196, third outlet connector 202 and third inlet connector 86 in response to the locator voltage on the conductive line 22. The receiving unit common 90 is floating ungrounded within the insulated receiving unit housing 48 and the ground pickup 114 is grounded, for example, by capacitively coupling with the operator, who in turn is coupled with the earth through his feet. Accordingly, the capacitive locator signal which appears in the coil shield 194 is received by the capacitive locator signal amplifier 116 via the receiving unit common 90. The capacitive locator signal amplifier 116 amplifies the difference between the capacitive locator signal and the ground reference 112 received via the ground pickup 114. The resulting differential capacitive locator signal is transmitted to the signal processing circuit 100.

The coil segment 188 of the pickup 16b also transmits a signal corresponding to the capacitive carrier signal to the carrier signal receiving circuit 98 via the first outlet connector 198 and first inlet connector 82 in response to the carrier voltage on the conductive line 22. The carrier signal receiving circuit 98 outputs the real and quadrature synchronization to the signal processing circuit 100 in substantially the same manner as described above with respect to the previous embodiment. The signal processing circuit 100 likewise processes the differential capacitive locator signal and the real and quadrature synchronization in substantially the same manner as described above with respect to the previous embodiment.

When the pickup 16b contacts the insulated conductor 18 downstream of the transmission point 32, but upstream of the open 20, the receiving unit 14 communicates an audible signal to the operator via the indicator subcircuit 147 in response to the voltage of the capacitive current. The magnitude of this voltage, and correspondingly the level of the audible signal, will remain substantially constant all along the insulated conductor 18 before the open 20. When the pickup 16b passes the open 20, the level of the audible signal drops abruptly and significantly because there is no detectable voltage due to capacitance along the insulated conductor 18 past the open 20.

As described above, the present embodiment locates clean opens in an insulated conductor. The present embodiment is also applicable to locating partial opens in an insulated conductor. The partial open is located in substantially the same manner as the clean open, but the very low internal resistance of the partial open requires more gain in the receiving unit 14. A relatively low level audible signal will also be present downstream past the partial open.

Although the shielded coil 16b is described above as a preferred pickup in the practice of the present embodiment, the present invention is not so limited. It is apparent to the skilled artisan that substantially any component functioning as a capacitive plate can serve as the pickup for the present embodiment within the scope of the present invention. However, use of the shielded coil 16b in the present embodiment is advantageous if the operator alternately wishes to practice the resistance fault locating method taught by U.S. Pat. No. 5,995,588 using the same device 10 and pickup 16b described herein.

While the forgoing preferred embodiments of the invention have been described and shown, it is understood that alternatives and modifications, such as those suggested and others, may be made thereto and fall within the scope of the invention.

I claim:

1. A method for locating an open in a conductive line of an insulated conductor beneath an earthen surface comprising:

introducing a locator signal into a conductive line of an insulated conductor beneath an earthen surface at a transmission point, wherein said conductive line is surrounded by an insulative sheath;

capacitively transmitting a ground current from capacitive points along said conductive line across said insulative sheath through earth to a ground reference in response to said locator signal, wherein said capacitive points are downstream of said transmission point and upstream of an open in said conductive line;

receiving a ground locator signal in response to said ground current flowing through earth to said ground reference past a pickup positioned at a downstream point proximal to one of said capacitive points; and detecting a component of said ground locator signal indicative of said open.

2. The method of claim 1 further comprising introducing a carrier signal into said conductive line upstream of said open, wherein said carrier signal includes synchronization of said locator signal.

3. The method of claim 2 wherein said ground current includes said synchronization from said carrier signal.

4. The method of claim 3 further comprising receiving a ground carrier signal in response to said ground current flowing through earth to said ground reference past said pickup positioned at said downstream point proximal to one of said capacitive points.

5. The method of claim 4 wherein said ground locator signal has a real component and a quadrature component differing from said real component by a 90° phase shift, said quadrature component is said component indicative of said open, and said ground carrier signal includes quadrature synchronization and real synchronization, further wherein said quadrature synchronization is used to exclude said real component when detecting said quadrature component.

6. The method of claim 1 wherein said transmission point is positioned between said ground reference and said capacitive points.

7. The method of claim 1 wherein said pickup has a first probe and a second probe spaced apart from one another along a pickup axis, further wherein said first and second probes are in electrical communication with earth at said downstream point to receive said ground locator signal.

8. The method of claim 7 wherein said pickup axis is aligned substantially perpendicular to the longitudinal axis of said insulated conductor at said one of said capacitive points.

9. The method of claim 7 wherein the position of said insulated conductor is located by monitoring a change in the polarity of said ground locator signal as said first and second probes are displaced laterally on said earthen surface relative to the path of said insulated conductor.

10. The method of claim 1 wherein said wherein said ground locator signal has a quadrature component and a real component, further wherein said quadrature component differs from said real component by a 90° phase shift.

11. The method of claim 10 wherein said component indicative of said open is said quadrature component.

12. The method of claim 11 further comprising locating a resistance fault in said insulated sheath at a point on said insulated conductor proximal to a succeeding downstream point where said real component substantially exceeds said quadrature component.

13. The method of claim 1 further comprising incrementally repositioning said pickup at succeeding downstream points proximal to said insulated conductor and away from said transmission point and locating said open at a point on said insulated conductor proximal to a succeeding downstream point where said component of said ground locator signal indicative of an open exhibits an abrupt change.

14. A method for locating an open in a conductive line of an insulated conductor beneath an earthen surface comprising:

introducing a locator signal and a carrier signal including synchronization of said locator signal into a conductive line of an insulated conductor beneath an earthen surface at a transmission point, wherein said conductive line is surrounded by an insulative sheath;

capacitively transmitting a ground current from capacitive points along said conductive line across said insulative sheath through earth to a ground reference in response to said locator and carrier signals, wherein said capacitive points are downstream of said transmission point and upstream of an open in said conductive line;

receiving a ground locator signal and a ground carrier signal in response to said ground current flowing through earth to said ground reference past a pickup positioned at a downstream point proximal to one of said capacitive points, wherein said ground locator signal has a real component and a quadrature component differing from said real component by a 90° phase shift and said ground carrier signal has real synchronization and quadrature synchronization; and detecting said quadrature component indicative of said open using said quadrature synchronization to exclude said real component.

15. The method of claim 14 wherein said pickup has a first probe and a second probe spaced apart from one another along a pickup axis, further wherein said first and second probes are in electrical communication with earth at said downstream point to receive said ground current.

16. The method of claim 14 further comprising incrementally repositioning said pickup at succeeding downstream points proximal to said insulated conductor and away from said transmission point and locating said open at a point on said insulated conductor proximal to a succeeding downstream point where said quadrature component exhibits an abrupt change.

17. The method of claim 14 further comprising locating a resistance fault in said insulated sheath at a point on said insulated conductor proximal to a succeeding downstream point where said real component substantially exceeds said quadrature component.

18. A method for locating an open in a conductive line of an insulated conductor on or above an earthen surface comprising:

electrically coupling a conductive line of an insulative conductor on or above an earthen surface to an electric power transmitting unit to introduce a locator signal and a carrier signal including synchronization of said locator signal into said conductive line at a transmission point, wherein said conductive line is surrounded by an insulative sheath;

moving a capacitive pickup along said insulated conductor downstream of said transmission point and upstream of an open;

capacitively transmitting a capacitive current from capacitive points along said conductive line across said insulative sheath to said capacitive pickup in response to said locator and carrier signals, wherein said capacitive points are downstream of said transmission point and upstream of an open in said conductive line;

receiving a capacitive locator signal and a capacitive carrier signal in response to capacitive transmission of said capacitive current from said pickup to an ungrounded common, wherein said capacitive locator signal has a real component and a quadrature component differing from said real component by a 90° phase shift and said capacitive carrier signal has real synchronization and quadrature synchronization; and detecting said quadrature component indicative of said open using said quadrature synchronization to exclude said real component.

19. The method of claim 18 further comprising locating said open at a point on said insulated conductor downstream of said transmission point where said quadrature component exhibits an abrupt change.

* * * * *